(12) United States Patent
Liang et al.

(10) Patent No.: US 10,490,760 B2
(45) Date of Patent: Nov. 26, 2019

(54) THIN-FILM TRANSISTOR INCLUDING CARBON NANOTUBES, MANUFACTURING METHOD, AND ARRAY SUBSTRATE

(71) Applicants: BOE TECHNOLOGY GROUP CO., LTD., Beijing (CN); PEKING UNIVERSITY, Beijing (CN)

(72) Inventors: Xuelei Liang, Beijing (CN); Guanbao Hui, Beijing (CN); Jiye Xia, Beijing (CN); Fangzhen Zhang, Beijing (CN); Boyuan Tian, Beijing (CN); Qiuping Yan, Beijing (CN); Lianmao Peng, Beijing (CN)

(73) Assignees: BOE TECHNOLOGY GROUP CO., LTD., Beijing (CN); PEKING UNIVERSITY, Beijing (CN)

( * ) Notice: Subject to any disclaimer, the term of this patent is extended or adjusted under 35 U.S.C. 154(b) by 0 days.

(21) Appl. No.: 15/542,408

(22) PCT Filed: Nov. 7, 2016

(86) PCT No.: PCT/CN2016/104884
§ 371 (c)(1),
(2) Date: Jul. 7, 2017

(87) PCT Pub. No.: WO2017/148176
PCT Pub. Date: Sep. 8, 2017

(65) Prior Publication Data
US 2018/0375045 A1    Dec. 27, 2018

(30) Foreign Application Priority Data
Mar. 1, 2016  (CN) .......................... 2016 1 0115020

(51) Int. Cl.
*H01L 29/786*    (2006.01)
*H01L 51/10*    (2006.01)
(Continued)

(52) U.S. Cl.
CPC ............ *H01L 51/107* (2013.01); *H01L 27/12* (2013.01); *H01L 27/283* (2013.01);
(Continued)

(58) Field of Classification Search
CPC .................................................. H01L 2251/303
See application file for complete search history.

(56) References Cited

U.S. PATENT DOCUMENTS 8,963,141 B2    2/2015  Murata
2001/0013607 A1*  8/2001  Miyasaka ............... F16C 29/00
                                                              257/66
(Continued)

FOREIGN PATENT DOCUMENTS

CN    101710588 A    5/2010

OTHER PUBLICATIONS

International Search Report and Written Opinion dated Feb. 16, 2017 in PCT/CN2016/104884.
1st Office Action dated Jan. 29, 2018 in CN201610115020.2.

*Primary Examiner* — Lex H Malsawma
*Assistant Examiner* — Geoffrey H Ida
(74) *Attorney, Agent, or Firm* — Syncoda LLC; Feng Ma

(57) ABSTRACT

The present disclosure provides a thin-film transistor having a plurality of carbon nanotubes in its active layer, its manufacturing method, and an array substrate. The manufacturing method as such comprises: forming an insulating layer to at least substantially cover a channel region of the active layer between a source electrode and a drain electrode of the thin-film transistor, wherein the insulating layer is configured to substantially insulate from an environment, and have substantially little influence on, the plurality of carbon nanotubes in the active layer.

10 Claims, 3 Drawing Sheets

(51) Int. Cl.
*H01L 27/12* (2006.01)
*H01L 51/00* (2006.01)
*H01L 51/05* (2006.01)
*H01L 27/28* (2006.01)

(52) U.S. Cl.
CPC .... *H01L 29/78684* (2013.01); *H01L 51/0015* (2013.01); *H01L 51/0048* (2013.01); *H01L 51/0525* (2013.01); *H01L 51/0545* (2013.01); *H01L 51/0558* (2013.01); *H01L 51/105* (2013.01); *H01L 2251/303* (2013.01)

(56) References Cited

U.S. PATENT DOCUMENTS

| | | | |
|---|---|---|---|
| 2003/0147333 A1* | 8/2003 | Tokuda | G11B 7/127 369/121 |
| 2004/0211995 A1* | 10/2004 | Park | B82Y 10/00 257/294 |
| 2005/0104056 A1* | 5/2005 | Nihei | B82Y 10/00 257/22 |
| 2011/0194327 A1* | 8/2011 | Kawae | G11C 11/403 365/72 |
| 2017/0288060 A1 | 10/2017 | Park | |

* cited by examiner

THIN-FILM TRANSISTOR INCLUDING CARBON NANOTUBES, MANUFACTURING METHOD, AND ARRAY SUBSTRATE

CROSS-REFERENCE TO RELATED APPLICATION

The present application claims priority to Chinese Patent Application No. 201610115020.2 filed on Mar. 1, 2016, the disclosure of which is hereby incorporated by reference in its entirety.

TECHNICAL FIELD

The present disclosure relates generally to display technologies, and more specifically to a thin-film transistor, its manufacturing method, and an array substrate.

BACKGROUND

Due to their excellent electrical and mechanical properties, single-walled carbon nanotubes have been widely applied in logic circuits and optical electronic devices, including field-effect transistors, inverters, ring oscillators and light emitting devices etc.

Synthesis of single-walled carbon nanotubes is mainly through chemical vapor deposition, arc discharge, or laser ablation, etc. The single-walled carbon nanotubes synthesized by these above approaches contain ~2/3 of semiconducting carbon nanotubes and ~1/3 of metallic carbon nanotubes.

Purification of semiconducting carbon nanotubes mainly includes a gel method, density gradient centrifugation, and polymer sorting, etc. Although high-purity single-walled semiconducting carbon nanotubes can be obtained by these above approaches, large-scale production has always been a challenge. Currently, the emergence of disordered carbon nanotube films has brought hope to this challenge. To date, carbon nanotube films with uniform distribution have been able to be prepared in large scale.

Utilization in field-effect transistors shall be an important application of carbon nanotube films. During fabrication of field-effect transistors, the bipolarity of carbon nanotubes that arises due to exposure to oxygen in the air may adversely affect the stability, reliability and mobility rate of the field-effect transistors. A reliable packaging method, therefore, is highly needed for the manufacturing of transistors with favorable features including high reliability, stability, and mobility rate.

SUMMARY

The present disclosure provides a thin-film transistor, its manufacturing method, and an array substrate, aiming at solving the issue of bipolarity of carbon nanotubes in conventional field-effect transistors due to exposure to oxygen in the environment.

In a first aspect, a method for manufacturing a thin-film transistor including a plurality of carbon nanotubes in an active layer is provided. The method comprises: forming an insulating layer to at least substantially cover a channel region of the active layer between a source electrode and a drain electrode of the thin-film transistor, wherein the insulating layer is configured to substantially insulate from an environment, and have substantially little influence on, the plurality of carbon nanotubes in the active layer.

Herein the insulating layer can comprise a metal oxide in some embodiments of the present disclosure, and can comprise some other compositions of similar functions as the metal oxide, as long as the insulating layer having such a composition can substantially insulate the plurality of carbon nanotubes in the active layer of the thin-film transistors from an environment, and can have substantially little influence on the electronic properties of plurality of carbon nanotubes. It is also favored that the insulating layer having such a composition does not substantially affect the fabrication process of the thin-film transistors having carbon nanotubes in the active layer.

In some embodiments of the method, forming an insulating layer to at least substantially cover a channel region of the active layer between a source electrode and a drain electrode of the thin-film transistor can be performed via a vapor deposition process. The vapor deposition process can include the use of a mask, which is configured to define a pattern of the insulating layer.

In some other embodiments of the method, forming an insulating layer to at least substantially cover a channel region of the active layer between a source electrode and a drain electrode of the thin-film transistor can be performed via a sputtering process.

The metal oxide as disclosed herein can comprise at least one of yttrium oxide or aluminum oxide. There are no limitations herein.

In some embodiments of the method, forming an insulating layer to at least substantially cover a channel region of the active layer between a source electrode and a drain electrode of the thin-film transistor can comprise at least one round of the following sub-steps:

Forming a metal layer to at least substantially cover the channel region of the active layer between the source electrode and the drain electrode; and Oxidizing the metal layer to form a metal oxide layer.

Herein the metal layer can comprise yttrium, but can comprise other metals as well. There are no limitations for the compositions.

Herein at least one round of the sub-steps as described above can be, for example, three rounds, but can be other numbers of the rounds depending on practical needs.

In some of the embodiments as described above, the sub-step of forming a metal layer to at least substantially cover the channel region of the active layer between the source electrode and the drain electrode can be performed by an electron beam coating process.

In some of the embodiments as described above, the sub-step of oxidizing the metal layer to form a metal oxide layer is performed by heating the metal layer in an oxygen-containing environment. A temperature for heating can be in a range of 20° C.-450° C., and can preferably be in a range of 200° C.-350° C.

In some others of the embodiments as described above, the sub-step of oxidizing the metal layer to form a metal oxide layer can be performed via a UV oxidization (UVO) process.

In some of the above embodiments, a thickness of the metal layer can be in a range of 5 nm-1000 nm, and can preferably be in a range of 20 nm-100 nm.

In any of the embodiments as described above, the plurality of carbon nanotubes can comprise single-walled carbon nanotubes, double-walled carbon nanotubes, carbon nanotube bundles, or their combinations. There are no limitations herein.

In a second aspect, a thin-film transistor is provided, which comprises: an active layer, which includes a plurality of carbon nanotubes; and an insulating layer, which is disposed over a channel region of the active layer between a source electrode and a drain electrode of the thin-film transistor and configured to insulate the plurality of carbon nanotubes in the channel region of the active layer from an environment to thereby improve a carrier mobility of the thin-film transistor.

Herein the insulating layer can comprise a metal oxide, for example, yttrium oxide or aluminum oxide, and can comprise some other compositions of similar functions and properties, as long as the insulating layer having such a composition can substantially insulate the plurality of carbon nanotubes in the active layer of the thin-film transistors from an environment, and can have substantially little influence on the electronic properties of plurality of carbon nanotubes. It is also favored that the insulating layer having such a composition does not substantially affect the fabrication process of the thin-film transistors having carbon nanotubes in the active layer.

Herein the plurality of carbon nanotubes can comprise at least one of single-walled carbon nanotubes, double-walled carbon nanotubes, or carbon nanotube bundles.

In a third aspect, the present disclosure further provides an array substrate, which can comprise at least one thin-film transistor according to any one of the embodiments as described above.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In an aspect, this present disclosure provides a method for fabricating a thin-film transistor including a plurality of carbon nanotubes in an active layer is provided. The method comprises: forming an insulating layer to at least substantially cover a channel region of the active layer between a source electrode and a drain electrode of the thin-film transistor, wherein the insulating layer is configured to substantially insulate from an environment, and have substantially little influence on, the plurality of carbon nanotubes in the active layer.

Figure 1:
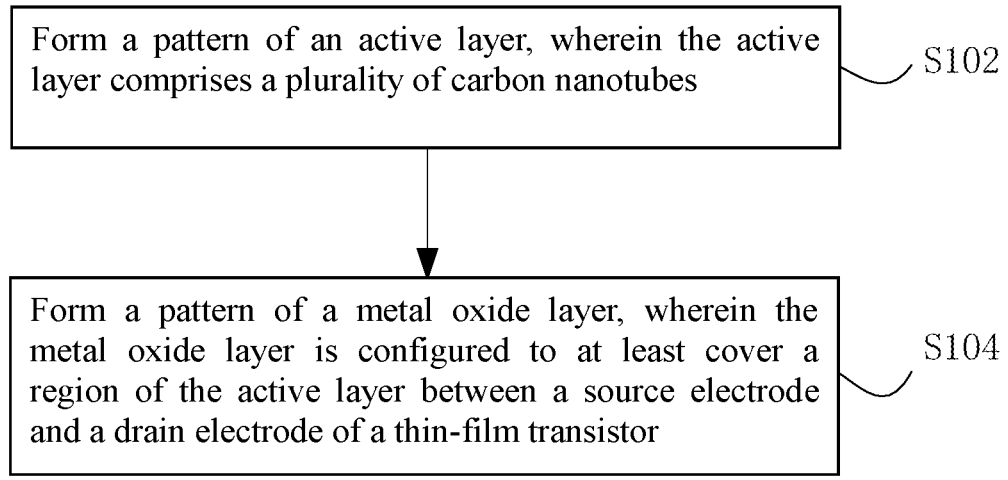
FIG. 1 is the flow chart of a method for fabricating a thin-film transistor according to some embodiments of the disclosure.

As shown in FIG. 1, the method according to some embodiments of the present disclosure where the insulating layer comprises a metal oxide can include the following steps:

S102: forming a pattern of an active layer, wherein the active layer comprises a plurality of carbon nanotubes;

S104: forming a pattern of a metal oxide layer, wherein the metal oxide layer is configured to at least cover a region of the active layer between a source electrode and a drain electrode of a thin-film transistor.

During fabrication of the thin-film transistor, gate electrodes can first be formed over a glass substrate; a gate insulating layer can then be formed over the gate electrodes; a pattern of an active layer can then be formed over the gate insulation layer by use of carbon nanotubes; and then a metal oxide layer, a source electrode, and a drain electrode can be formed. The complete region between a source electrode and a drain electrode of a thin-film transistor is usually referred to as channel, and as such the metal oxide layer at least covers the channel.

As such, via the above-mentioned fabrication method, carbon nanotube bottom-gate thin-film transistors can be effectively manufactured by forming a metal oxide layer over the active layer comprising carbon nanotubes. Because of presence of the oxide layer, the active layer comprising carbon nanotubes is effectively separated from oxygen in the air, and thus the bipolarity issue is effectively avoided, which ultimately leads to an increase of the reliability, stability and mobility rate of the thin-film transistors.

Two embodiments are provided for the step S104 of forming a pattern of a metal oxide layer.

In a first embodiment of the method, the pattern of the metal oxide layer can be formed by a vapor deposition process, whereby the whole region of the active layer between the source electrode and the drain electrode of the thin-film transistor undergoes vapor deposition to form the pattern of the metal oxide layer.

In some embodiments, the metal oxide can be yttrium oxide, but can also be other metal oxides that have a similar property of yttrium oxide. There are no limitations herein.

When applying the above embodiment of the method, a mask can be combined to directly perform vapor deposition over the channel of the active layer to ultimately form the pattern of the metal oxide layer over the channel. Other processes, such as a sputtering process, can also be used to form the pattern of the metal oxide layer over the channel of the active layer. There are no limitations herein.

In a second embodiment of the fabrication method, the pattern of the metal oxide layer can be formed through two sub-steps. First, a pattern of a metal layer can be formed over the active layer, wherein the pattern of the metal layer at least covers the region of the active layer between the source electrode and the drain electrode of the thin-film transistors. Second, the metal layer can be oxidized to form the pattern of the metal oxide layer.

An electron beam coating process can be applied to form the pattern of the metal oxide layer in the above embodiment of the method. Other processes are also possible, and there are no limitations herein.

During fabrication, the metal layer can be formed directly on the channel region of the active layer by accurate control.

Alternatively, a metal layer can first be formed on a region of the active layer that is larger than the channel region (i.e. including the channel region, part of the source electrode region, and part of the drain electrode region), and the portion of the metal layer that covers the part of the source electrode region and the part of the drain electrode region can then be etched away. The above two approaches can be selected depending on specific needs.

Oxidation of the metal layer can be performed by one of the two following manners: (1) by heating the thin-film transistors having the metal layer in oxygen; or (2) through a UV oxidization (UVO) process.

As for the manner (1), the heating temperature can be controlled in a range of 20-450° C., and preferably in a range of 200° C.—350° C. for better efficiency.

As for the manner (2), the thickness of the to-be-formed metal layer can be controlled in a range of 5 nm-1000 nm, and preferably in the range of 20 nm-100 nm for better properties and performance of the thin-film transistors.

In this present disclosure, the metal layer can comprise yttrium. After oxidation, yttrium oxide has little influence on the carbon nanotubes, which can ensure the performance of the thin-film transistors to the greatest extent. Besides yttium, other metals having similar properties as yttium can also be used.

The carbon nanotubes in the disclosure can be single-walled carbon nanotubes, double-walled carbon nanotubes, or carbon nanotube bundles. These different types of carbon nanotubes can be dispersed in a proper organic solvent to be used for the fabrication method as described above.

Figure 2:
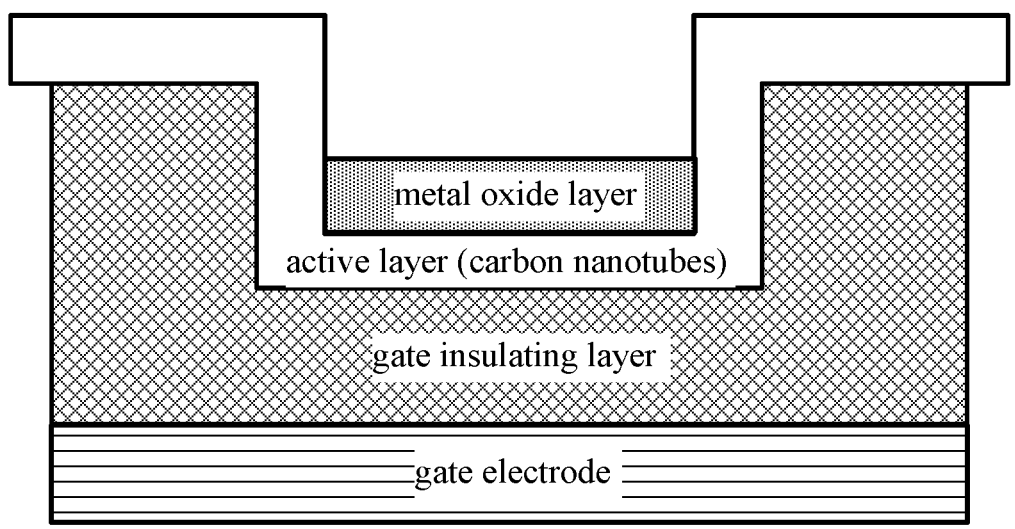
FIG. 2 is the schematic diagram of the structure of a thin-film transistor according to some embodiments of the disclosure.

In another aspect, this present disclosure provides a thin-film transistor, as illustrated in FIG. 2. In addition to the arrangement of a metal oxide layer over the active layer, performed by the fabrication method as described above, other parts and structural features are the same as in a conventional thin-film transistor, which are not described herein.

Figure 3:
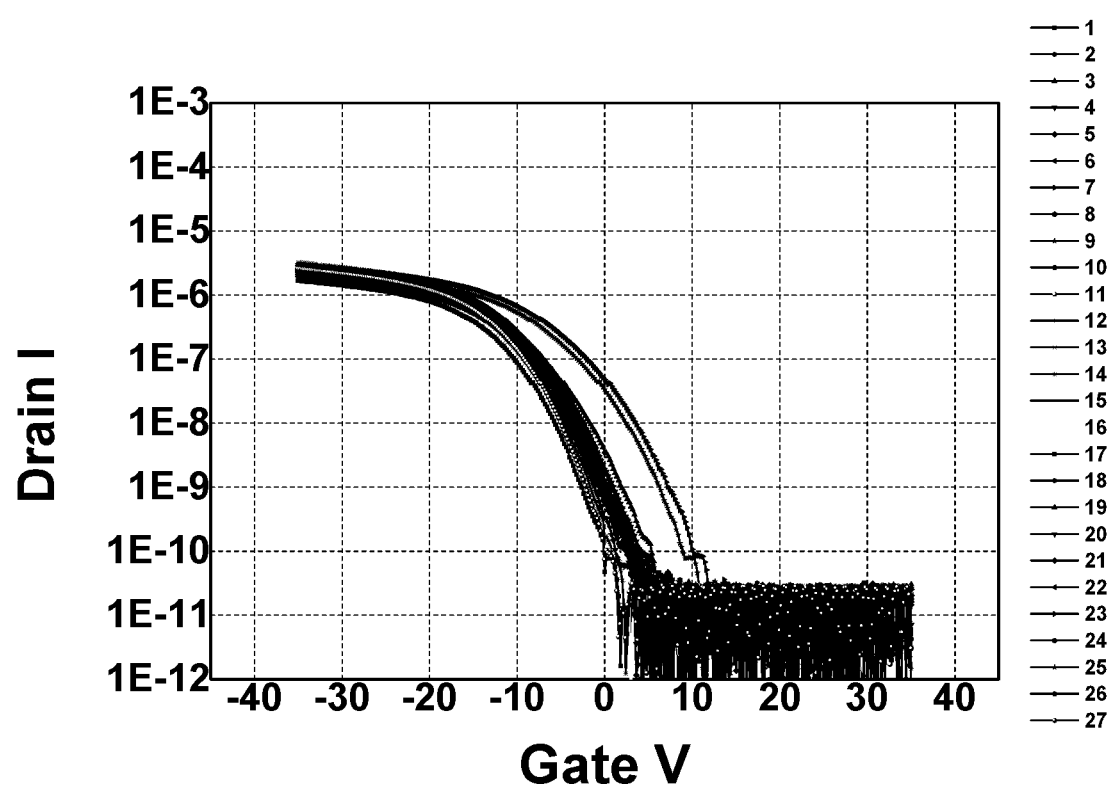
FIG. 3 shows the transition characteristics curves for multiple samples of the carbon nanotube bottom-gate thin-film transistor prior to forming a metal oxide layer according to some embodiments of the disclosure.
Figure 4:
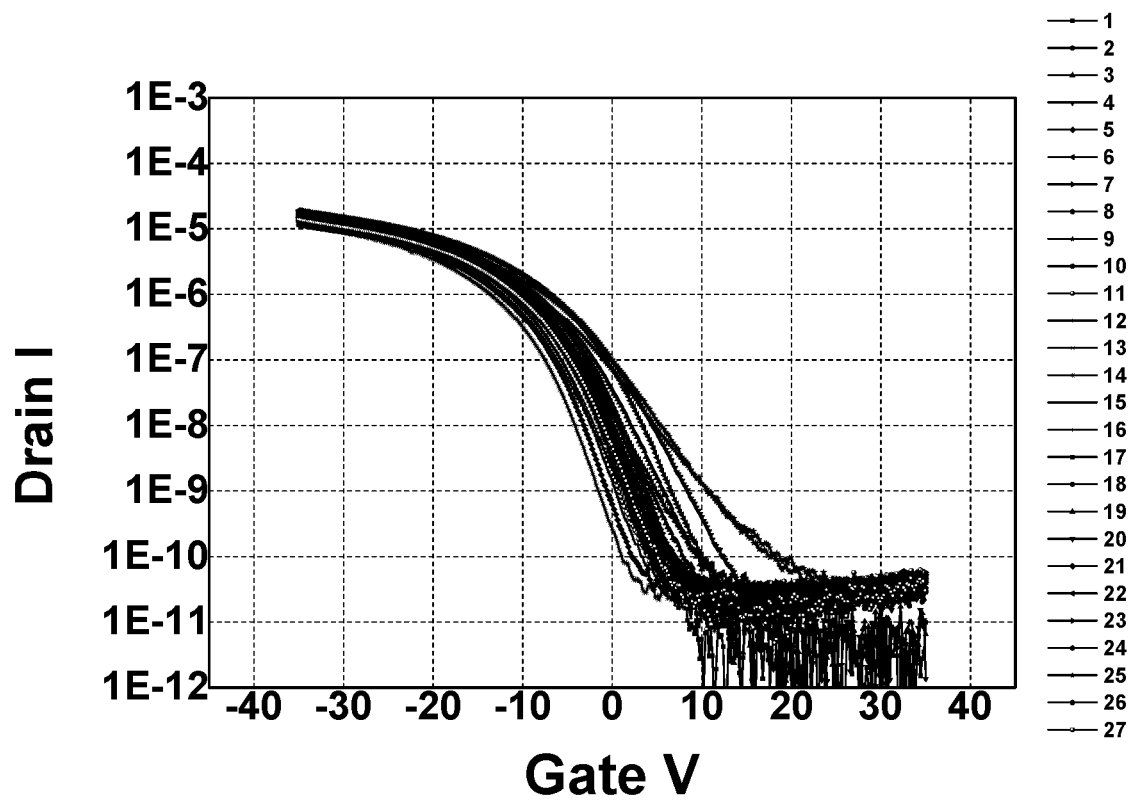
FIG. 4 shows the transition characteristics curves for multiple samples of the carbon nanotube bottom-gate thin-film transistor after forming the metal oxide layer according to some embodiments of the disclosure.

With reference to FIGS. 3 and 4, some embodiments of the method for fabricating a thin-film transistor, and the thin-film transistor manufactured thereby will be described in detail in the following.

In one embodiment for a carbon nanotube bottom-gate thin-film transistor, an yttrium layer is formed over the active layer by an electron beam coating process as described above, and the yttrium layer is then oxidized to become an yttrium oxide layer.

Specifically, the method for fabricating such a carbon nanotube bottom-gate thin-film transistor comprises the following steps.

(1) Organic solvent-dispersed carbon nanotubes can be deposited on a RCA Clean-treated substrate (e.g. silicon substrate or silicon dioxide substrate). After deposition treatment for ~24 hr, the substrate is taken out for cleansing using ortho-xylene (i.e. o-xylene), and is then dried at 150° C. for 30 min. The organic solvent for dispersing the carbon nanotubes can be xylene, toluene, chloroform, or para-xylene.

(2) A source and drain metal layer can be formed by optical exposure, and after forming a carbon nanotube film etching layer by optical exposure, the unneeded carbon nanotube film can be etched away by reactive ion etching (RIE) to ultimately obtain the carbon nanotube bottom-gate thin-film transistor.

(3) The transition characteristics curve of the carbon nanotube bottom-gate thin-film transistor exposed in the air can be measured. FIG. 3 shows the transition characteristics curves for multiple carbon nanotube bottom-gate thin-film transistor samples prior to forming the metal oxide layer according to some embodiments. The transition characteristics curve refers to the relationship between the voltage on the gate electrode (the horizontal coordinate Gate V, scanning from $-35$ V to 35 V) and the output current on the source and drain electrodes (the vertical coordinate Drain I) when the source/drain electrode bias voltage $V_{ds}=-1$ V. In FIG. 3, the transition characteristics curves for a total of 27 samples of the carbon nanotube bottom-gate thin-film transistors are provided.

(4) The yttrium layer, of a thickness of, for example 40 nm, can be deposited on the channel region of the carbon nanotube bottom-gate thin-film transistor via an electron beam coating machine.

(5) The yttrium layer can be oxidized by a heating oxidization process in the air or in the oxygen, or by a UVO process in the oxygen. It is preferred that oxidization of the yttrium layer is performed in the oxygen to ensure a high oxidization efficiency.

The treating temperature and time can be selected based on practical needs. For example, in the embodiments disclosed herein, the treating temperature can be in the range of 180-250° C., and preferably at ~250° C., and in accordance, the treating time can be ranged 10 min-60 min, and for example, 30 min.

It should be noted that in the embodiments described herein, Step (4) and Step (5) can be repeated for three times in order to improve the performance of the transistors and to provide better protection. There are no limitations on whether or not these steps are repeated, which depends on practical needs.

(6) The transition characteristics curves of the carbon nanotube bottom-gate thin-film transistor covered by yttrium oxide can be measured. FIG. 4 shows the transition characteristics curves for multiple samples of the carbon nanotube bottom-gate thin-film transistor after forming the metal oxide layer according to some embodiments of the disclosure. The transition characteristics curve refers to the relationship between the voltage on a gate electrode (the horizontal coordinate Gate V, in FIG. 4, scanning from $-35$ V to 35 V) and the output current on the source and drain electrodes (the vertical coordinate Drain I in FIG. 4) when the source/drain electrode bias voltage $V_{ds}=-1$ V. FIG. 4 provides transition characteristics curves for a total of 27 samples of the carbon nanotube bottom-gate thin-film transistors.

As shown in FIGS. 3 and 4, compared with the transition characteristics curves of the carbon nanotube bottom-gate thin-film transistor exposed in the air for 27 samples, the transition characteristics curves of the carbon nanotube bottom-gate thin-film transistor covered by yttrium oxide for these samples exhibit not-so-concentrated output currents from the source-drain electrodes. In other words, the electron mobility in the 27 samples of the carbon nanotube bottom-gate thin-film transistor becomes more even, and thus the mobility rate and reliability in the 27 samples of the carbon nanotube bottom-gate thin-film transistor are greatly improved.

As mentioned above, the carbon nanotubes in this embodiment can be selected from any one of single-walled carbon nanotubes, double-walled carbon nanotubes, or carbon nanotube bundles.

In the embodiment as described above, an yttrium layer is deposited on the channel region of the carbon nanotube bottom-gate thin-film transistor via an electron beam coating machine, and the yttrium layer is further oxidized to become an yttrium oxide layer. The yttrium oxide layer has little influence on the carbon nanotube film, and in addition to its role in partially separating the carbon nanotube film from the air, it can also inhibit the bipolarity resulting from the separation of the channel from oxygen, and can further improve the carrier mobility of the bottom-gate transistors.

In another aspect, the present disclosure provides an array substrate, which includes the thin-film transistor as described above.

The method as described above does not affect the normal fabrication of the carbon nanotube thin-film transistors, and does not increase the difficulty in the fabrication process. Furthermore, it can also inhibit the bipolarity resulting from the separation of the channel from oxygen, and can further improve the carrier mobility of the carbon nanotube bottom-gate transistors.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for manufacturing a bottom-gate thin-film transistor including a plurality of carbon nanotubes in an active layer, comprising:
    forming a source and drain metal layer by optical exposure;
    forming a carbon nanotube film etching layer containing the plurality of carbon nanotubes by optical exposure;
    etching away unneeded portion of the carbon nanotube film etching layer by reactive ion etching (RIE);
    measuring transition characteristics curve of the carbon nanotube bottom-gate thin-film transistor exposed in air;
    depositing a 20 nm-100 nm yttrium metal layer over a channel region of the active layer via electron beam coating;
    forming an insulating layer by UV oxidization (UVO) of the yttrium metal layer to at least substantially cover a channel region of the active layer between a source electrode and a drain electrode of the bottom-gate thin-film transistor, wherein the insulating layer is configured to substantially insulate the channel region of the active layer from an environment, and have substantially little influence on the plurality of carbon nanotubes in the active layer; and
    thereby obtaining the bottom-gate thin-film transistor with improved electron mobility and reliability compared with the measured transition characteristics curve prior to the forming of the insulating layer.

2. The method of claim 1, wherein the insulating layer comprises an yttrium metal oxide.

3. The method of claim 2, wherein the forming an insulating layer comprises defining a pattern of the insulating layer.

4. The method of claim 2, wherein the forming an insulating layer comprises at least one round of:
    the depositing the yttrium metal layer; and
    oxidizing the yttrium metal layer to form a metal oxide layer composing the insulating layer.

5. The method of claim 4, wherein the oxidizing the yttrium metal layer to form a metal oxide layer is performed by heating the metal layer in an oxygen-containing environment.

6. The method of claim 4, wherein the forming an insulating layer to at least substantially cover a channel region of the active layer between the source electrode and the drain electrode of the thin-film transistor comprises three rounds of the depositing the yttrium metal layer and the oxidizing the yttrium metal layer.

7. The method of claim 1, wherein the plurality of carbon nanotubes comprise at least one type of single-walled carbon nanotubes, double-walled carbon nanotubes, or carbon nanotube bundles.

8. A bottom-gate thin-film transistor formed according to the method of claim 1, comprising:
    the active layer, including a plurality of carbon nanotubes; and
    the yttrium metal oxide layer, disposed over a channel region of the active layer between a source electrode and a drain electrode of the thin-film transistor and configured to insulate the plurality of carbon nanotubes in the channel region of the active layer from an environment to thereby improve the electron mobility of the bottom-gate thin-film transistor.

9. The bottom-gate thin-film transistor of claim 8, wherein the plurality of carbon nanotubes comprise at least one type of single-walled carbon nanotubes, double-walled carbon nanotubes, or carbon nanotube bundles.

10. An array substrate, comprising the bottom-gate thin-film transistor according to claim 8.

* * * * *